(12) United States Patent
Kudoh (10) Patent No.: US 10,964,620 B2
(45) Date of Patent: Mar. 30, 2021

(54) THERMALLY CONDUCTIVE SHEET

(71) Applicant: SEKISUI POLYMATECH CO., LTD., Saitama (JP)

(72) Inventor: Hiroki Kudoh, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 239 days.

(21) Appl. No.: 16/086,202

(22) PCT Filed: Feb. 27, 2017

(86) PCT No.: PCT/JP2017/007389
§ 371 (c)(1),
(2) Date: Sep. 18, 2018

(87) PCT Pub. No.: WO2017/179318
PCT Pub. Date: Oct. 19, 2017

(65) Prior Publication Data
US 2020/0243414 A1    Jul. 30, 2020

(30) Foreign Application Priority Data

Apr. 11, 2016  (JP) .............................. JP2016-079171

(51) Int. Cl.
*F28F 7/00* (2006.01)
*H01L 23/373* (2006.01)
(Continued)

(52) U.S. Cl.
CPC .......... *H01L 23/373* (2013.01); *F28F 21/02* (2013.01); *H01L 23/42* (2013.01);
(Continued)

(58) Field of Classification Search
CPC ........ H01L 23/373; H01L 23/42; F28F 21/02; F28F 2255/06; H05K 7/20481;
(Continued)

(56) References Cited

U.S. PATENT DOCUMENTS

2004/0152829 A1  8/2004  Tobita et al.
2005/0101719 A1  5/2005  Ishihara
(Continued)

FOREIGN PATENT DOCUMENTS

CN    105001450 A    10/2015
EP    2 887 391 A2   6/2015
(Continued)

OTHER PUBLICATIONS

Office Action (The First Office Action) dated Oct. 23, 2019, by the State Intellectual Property Office of People's Republic of China in corresponding Chinese Patent Application No. 201780016876.7 and an English Translation of the Office Action. (14 pages).
(Continued)

*Primary Examiner* — Henry T Crenshaw
*Assistant Examiner* — Kamran Tavakoldavani
(74) *Attorney, Agent, or Firm* — Buchana, Ingersoll & Rooney PC (57) ABSTRACT

To provide a thermally conductive sheet that has high thermal conductivity. A thermally conductive sheet contains carbon fibers and a flake graphite powder that are dispersed in a polymer matrix. The flake graphite powder is disposed between the carbon fibers, the fiber axis directions of the carbon fibers are oriented in a sheet thickness direction Z, long axis directions of flake surfaces of the flake graphite powder are oriented in the sheet thickness direction Z, and normal directions to the flake surfaces are randomly oriented in a surface direction of the sheet. A mass ratio of the carbon fibers to the flake graphite powder is in a range of 120:10 to 60:70. According to this thermally conductive sheet, the thermal conductivity can be increased compared to when carbon fibers are used alone or a flake graphite powder is used alone.

10 Claims, 3 Drawing Sheets

(51) Int. Cl.
*F28F 21/02* (2006.01)
*H01L 23/42* (2006.01)
*H05K 7/20* (2006.01)
*C08K 3/04* (2006.01)
*C08K 7/06* (2006.01)

(52) U.S. Cl.
CPC ........... *H05K 7/20481* (2013.01); *C08K 3/04* (2013.01); *C08K 7/06* (2013.01); *C08K 2201/001* (2013.01); *F28F 2255/06* (2013.01)

(58) Field of Classification Search
CPC ................ C08K 3/04; C08K 2201/001; C08K 2201/016; C08K 7/06; C09K 5/14; B29C 45/0005; B29K 2105/06; B29K 2307/04; B29K 2507/04; B29K 2995/0013; C08J 5/042; C08J 5/10; C08J 5/18
USPC ........ 428/364, 367, 372, 375, 378, 402, 408
See application file for complete search history.

(56) References Cited

U.S. PATENT DOCUMENTS

| | | | | |
|---|---|---|---|---|
| 2006/0035085 | A1* | 2/2006 | Ozaki | C04B 35/63468 428/408 |
| 2010/0292538 | A1* | 11/2010 | Hirata | G02B 23/2476 600/129 |
| 2012/0091388 | A1* | 4/2012 | Felisari | C08J 9/0066 252/62 |
| 2012/0322935 | A1 | 12/2012 | Atarashi | |
| 2016/0060793 | A1* | 3/2016 | Sugiura | D01F 9/225 428/367 |
| 2016/0244588 | A1* | 8/2016 | Kotaka | C09K 19/3809 |
| 2017/0114160 | A1* | 4/2017 | Kamada | B29C 67/246 |
| 2018/0201776 | A1* | 7/2018 | Xu | B32B 15/14 |

FOREIGN PATENT DOCUMENTS

| | | |
|---|---|---|
| EP | 3 419 399 A1 | 12/2018 |
| JP | 200451852 A | 2/2004 |
| JP | 2005146057 A | 6/2005 |
| JP | 2006335958 A | 6/2005 |
| JP | 2010-254766 A | 11/2010 |
| JP | 2012171986 A | 9/2012 |
| JP | 2014001388 A | 1/2014 |
| WO | 2010/116891 A1 | 10/2010 |
| WO | 2015/050263 A1 | 4/2015 |
| WO | 2017/179318 A1 | 10/2017 |

OTHER PUBLICATIONS

The extended European Search Report dated Oct. 1, 2019, by the European Patent Office in corresponding European Patent Application No. 17782136.0-1211. (5 pages).

International Search Report with English Translation and Written Opinion issued in International Patent Application No. PCT/JP2017/007389, 6 pages (dated May 23, 2017).

Office Action (Notice of Reasons for Refusal) dated Oct. 29, 2019 by the Japanese Patent Office in corresponding Japanese Patent Application No. 2019-088161, and an English Translation of the Office Action. (8 pages).

* cited by examiner

THERMALLY CONDUCTIVE SHEET

TECHNICAL FIELD

The present invention relates to a thermally conductive sheet used while being placed between a heat-generating element and a heat-dissipating element.

BACKGROUND ART

In some electronic appliances such as computers and automobile parts, heat-dissipating elements, such as heat sinks, for dissipating heat generated from heat-generating elements, such as semiconductor devices and mechanical parts, are used, and thermally conductive sheets are sometimes placed between the heat-generating elements and the heat-dissipating elements to enhance the efficiency of transferring heat to the heat-dissipating elements. One example of such thermally conductive sheets is a thermally conductive sheet disclosed in Japanese Unexamined Patent Application Publication No. 2005-146057 (PTL 1), in which carbon fibers are loaded as a thermally conductive material, and oriented. Furthermore, Japanese Unexamined Patent Application Publication No. 2014-001388 (PTL 2) discloses a thermally conductive sheet in which carbon powder is oriented in the thickness direction of the sheet.

CITATION LIST

Patent Literature

PTL 1: Japanese Unexamined Patent Application Publication No. 2005-146057
PTL 2: Japanese Unexamined Patent Application Publication No. 2014-001388

SUMMARY OF INVENTION

Technical Problem

In recent years, electronic appliances have increasingly become smaller and more advanced in terms of performance, and the amount of heat generated therefrom has increased steadily. Thus, a thermally conductive sheet that has higher thermal conductivity than the thermally conductive sheets disclosed in Japanese Unexamined Patent Application Publication No. 2005-146057 (PTL 1) and Japanese Unexamined Patent Application Publication No. 2014-001388 (PTL 2) are anticipated.

The present invention has been made under the circumstances described above. That is, an object of the present invention is to provide a thermally conductive sheet that has high thermal conductivity.

Solution to Problem

The present invention that achieves the object described above has the following features.

A thermally conductive sheet includes carbon fibers and a flake graphite powder that are dispersed in a polymer matrix, in which the flake graphite powder is disposed between the carbon fibers, fiber axis directions of the carbon fibers are oriented in a sheet thickness direction, long axis directions of flake surfaces of the flake graphite powder are oriented in the sheet thickness direction, normal directions to the flake surfaces are randomly oriented in a surface direction of the sheet, and a mass ratio of the carbon fibers to the flake graphite powder is in a range of 120:10 to 60:70.

Regarding the thermally conductive sheet including carbon fibers and a flake graphite powder that are dispersed in a polymer matrix, because the flake graphite powder is disposed between the carbon fibers, fiber axis directions of the carbon fibers are oriented in a sheet thickness direction, long axis directions of flake surfaces of the flake graphite powder are oriented in the sheet thickness direction, and normal directions to the flake surfaces are randomly oriented in a surface direction of the sheet, the carbon fibers and the flake graphite powder that are far from each other in the sheet surface direction can contact with one another easily. Moreover, since the carbon fibers and the flake graphite powder are oriented in the sheet thickness direction, the thermally conductive sheet can have high thermal conductivity in the sheet thickness direction.

Moreover, since, in this thermally conductive sheet, the mass ratio of the carbon fibers to the flake graphite powder is in a range of 120:10 to 60:70, higher thermal conductivity can be obtained than cases where the carbon fibers are contained alone or the flake graphite powder is contained alone. This range can be expressed differently as follows: the mass ratio of the carbon fibers relative to the total mass of the carbon fibers and the flake graphite powder is in the range of 0.46 to 0.92.

According to this thermally conductive sheet, the carbon fibers and the flake graphite powder may be contained so that a total mass of the carbon fibers and the flake graphite powder is 80 to 180 parts by mass relative to 100 parts by mass of the polymer matrix.

Since the carbon fibers and the flake graphite powder are contained so that a total mass of the carbon fibers and the flake graphite powder is 80 to 180 parts by mass relative to 100 parts by mass of the polymer matrix, a flexible thermally conductive sheet can be obtained without impairing the flexibility of the thermally conductive sheet.

The thermally conductive sheet may further include a thermally conductive filler other than the carbon fibers and the flake graphite powder, the thermally conductive filler having an average particle diameter smaller than an average fiber length of the carbon fibers and an average particle diameter of the flake graphite powder, and having an aspect ratio of 2 or less.

Since the thermally conductive sheet further includes a thermally conductive filler other than the carbon fibers and the flake graphite powder, the thermally conductive filler having an average particle diameter smaller than an average fiber length of the carbon fibers and an average particle diameter of the flake graphite powder, and having an aspect ratio of 2 or less, contact between particles of the thermally conductive filler is promoted not only in the sheet thickness direction but also in a direction perpendicular to the sheet thickness direction, and, as a result, the thermal conductivity in the sheet thickness direction can be increased.

The additional thermally conductive filler other than the carbon fibers and the flake graphite powder can be aluminum oxide or aluminum hydroxide.

Since the additional thermally conductive filler other than the carbon fibers and the flake graphite powder is aluminum oxide or aluminum hydroxide, the additional thermally conductive filler can be randomly dispersed in the polymer matrix without being affected by the magnetic field, and can be present in the gaps between the carbon fibers and the flake graphite powder so that the thermal conductivity of the thermally conductive sheet can be increased.

The thermally conductive sheet may contain a total of 380 to 790 parts by mass of the carbon fibers, the flake graphite powder, and the thermally conductive filler relative to 100 parts by mass of the polymer matrix.

Because the thermally conductive sheet contains a total of 380 to 790 parts by mass of the carbon fibers, the flake graphite powder, and the thermally conductive filler relative to 100 parts by mass of the polymer matrix, a thermally conductive sheet having excellent thermal conductivity can be obtained without impairing flexibility.

Advantageous Effects of Invention

A thermally conductive sheet of the present invention has flexibility and high thermal conductivity.

DESCRIPTION OF EMBODIMENTS

A thermally conductive sheet of the present invention will now be described in detail through embodiments. A thermally conductive sheet is formed of a polymer matrix that contains carbon fibers, flake graphite powder, and an additional thermally conductive filler other than the carbon fibers and the flake graphite powder.

Figure 1:
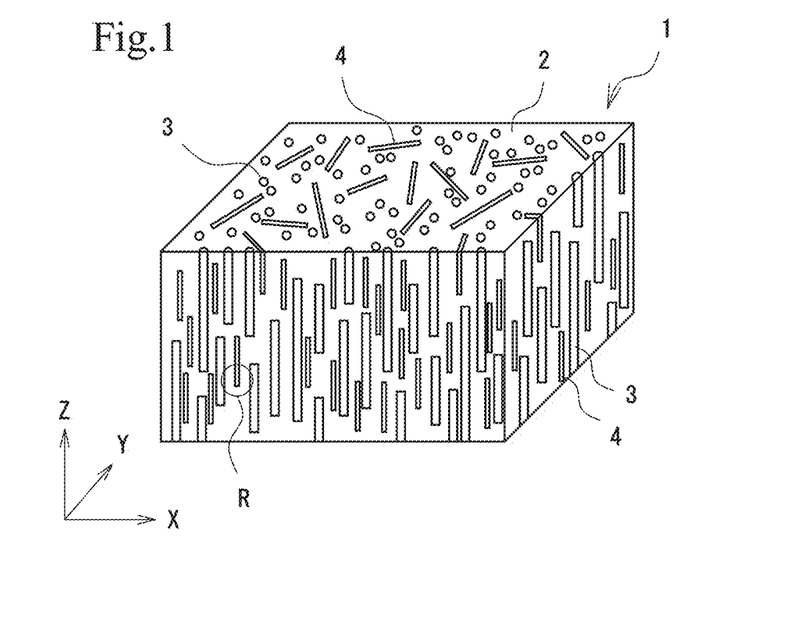
FIG. 1 is a schematic diagram of a thermally conductive sheet.
Figure 2:
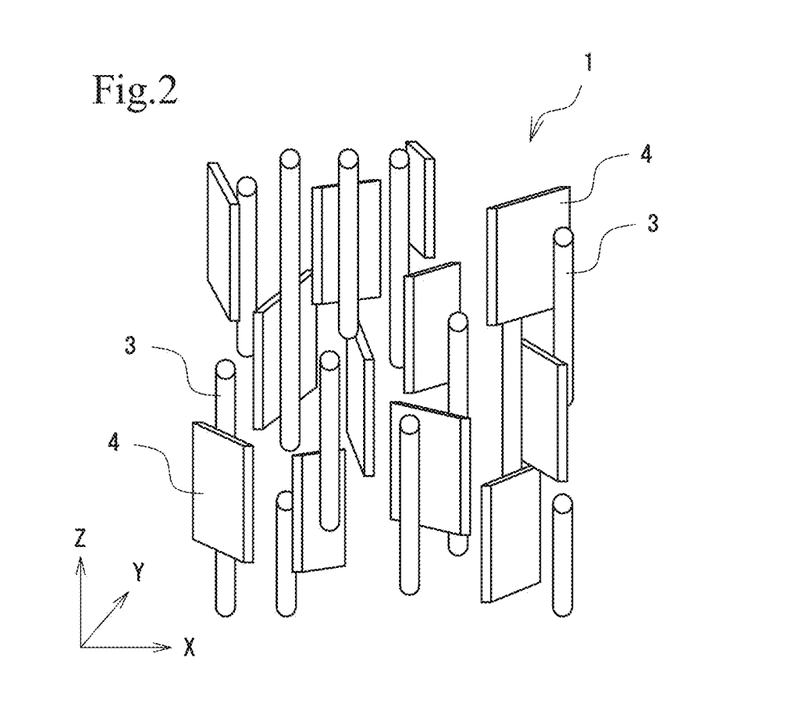
FIG. 2 is a schematic diagram illustrating a state in which carbon fibers and a flake graphite powder are oriented in the thermally conductive sheet.
Figure 3:
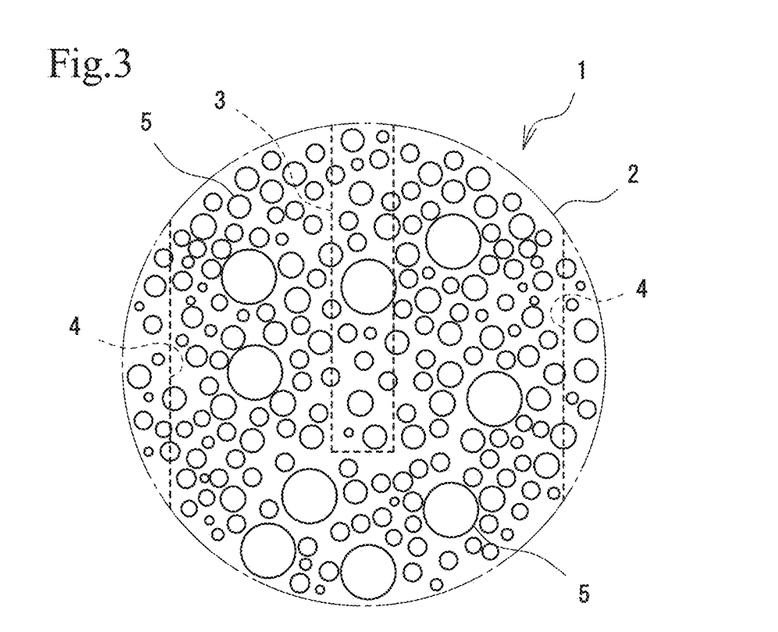
FIG. 3 is a schematic diagram illustrating a state in which an additional thermally conductive filler is contained in the thermally conductive sheet, and is a partial enlarged view of a region R in FIG. 1.

More specifically, as illustrated in the schematic diagram in FIG. 1, in a thermally conductive sheet 1, carbon fibers 3 and a flake graphite powder 4 are oriented in a particular direction in a polymer matrix 2. The directions of orientation will now be described in detail. As illustrated in an enlarged schematic diagram in FIG. 2, the carbon fibers 3 are contained while their fiber axis directions are oriented in the sheet thickness direction (the Z direction in FIG. 2), and the flake graphite powder 4 is contained while the long axis directions of the flake surfaces are oriented in the sheet thickness direction (the Z direction in FIG. 2) and the directions of the short axes (the normal directions to the flake surfaces) are randomly oriented (random directions within the X-Y plane in FIG. 2) and perpendicular to the long axes. Furthermore, as illustrated in an enlarged schematic diagram in FIG. 3, unlike the carbon fibers 3 and the flake graphite powder 4, the additional thermally conductive filler 5 is contained while being randomly dispersed in the polymer matrix 2.

Figure 4:
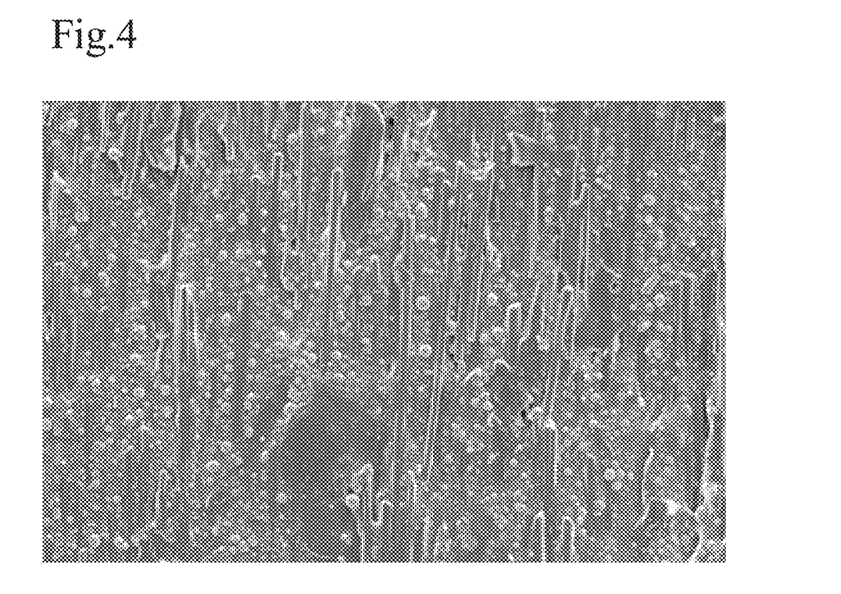
FIG. 4 is a 170× magnification microscope image of a section of the thermally conductive sheet cut along the carbon fiber orientation direction.

Although the above description schematically describes the thermally conductive sheet 1, an actual thermally conductive sheet is in a state illustrated in FIG. 4 when a section of the actual thermally conductive sheet is observed with an electron microscope; thus, in the present invention, the state in which the carbon fibers are oriented in the sheet thickness direction is defined as a state in which the fiber axis directions of more than 50% of the carbon fibers are oriented within a 15° range with respect to the sheet thickness direction. Furthermore, the state in which the flake graphite powder is oriented in the sheet thickness direction is defined as a state in which the surface directions of more than 50% of the flake surfaces of the flake graphite powder are oriented within a 15° range with respect to the sheet thickness direction.

Furthermore, the state in which the normal directions to the flake surfaces of the flake graphite powder are randomly oriented in the surface direction is defined as a state in which the percentage of the flake graphite powder with their normal directions oriented within a 15° range with respect to a particular direction within the sheet surface is less than 50%. In other words, when the percentage of the flake graphite powder with its normal direction oriented within a 15° range with respect to the particular direction within the sheet surface is more than 50%, such a state is not a state in which the normal directions of the flake graphite powder are random in the surface direction.

Such a state of orientation can be confirmed through observation of a section with an electron microscope.

The materials contained in this thermally conductive sheet will now be described.

(Polymer Matrix:)

The polymer matrix is a member that holds the thermally conductive filler, and is formed of a flexible rubber-like elastic body. In order to incorporate carbon fibers and a flake graphite powder in an oriented state, flowability is necessary during the step of orientation. For example, when a thermoplastic resin is involved, the thermoplastic resin is heated and plasticized so that the carbon fibers and the flake graphite powder can be oriented. Furthermore, when a reactive liquid resin is involved, the carbon fibers and the flake graphite powder are oriented prior to curing, and while maintaining this state, curing is conducted so that a cured product in which the carbon fibers and the flake graphite powder are oriented can be obtained. Since the former resin has a relatively high viscosity and may undergo thermal deterioration once plasticized to a low viscosity, the latter resin is preferably employed.

The reactive liquid resin is preferably a rubber or a gel that is liquid before the reaction and forms a crosslinked structure when cured under particular conditions. The crosslinked structure refers to a polymer, at least part of which is three-dimensionally crosslinked and which forms a cured body that does not melt under heating. Moreover, in order to prepare a mixed composition by adding a thermally conductive filler to a liquid resin and to have the carbon fibers and the flake graphite powder oriented in the flowing liquid resin, the reactive liquid resin preferably has low viscosity and is preferably curable under particular conditions after the orientation.

Examples of the curing method for the reactive liquid resin include a thermal curing method and a light curing method; however, since large quantities of carbon fibers and a flake graphite powder that block light are contained, a thermosetting rubber or gel is preferably used. More specific examples include addition-reaction-type silicone, urethane rubber that utilizes the reaction between a polyol and an isocyanate, an acrylic rubber that utilizes the radical reaction or cation reaction of an acrylate, and epoxy resins having flexible skeletons; however, addition-reaction-type silicone is preferably used. This is because the addition-reaction-type silicone can be easily loaded with large amounts of the carbon fibers, the flake graphite powder, and the additional thermally conductive filler, and can be adjusted to cure at a particular temperature by using a catalyst or the like. More specifically, a combination of an alkenyl-group-containing polyorganosiloxane and hydrogen organopolysiloxane is preferable since the viscosity is low and a large amount of the thermally conductive filler can be loaded.

(Carbon Fibers:)

The carbon fibers contained in the polymer matrix include carbon fibers of various shapes, such as a filament shape, a rod shape, and a needle shape. In the carbon fibers, the graphite crystal planes are continuously aligned in the fiber axis direction, and extremely high thermal conductivity is exhibited in the fiber axis direction. Thus, by orienting the fiber axis directions in a particular direction, the thermal conductivity in that direction can be increased.

The carbon fibers are preferably graphitized, and examples of the material therefor include fused polycyclic hydrocarbon compounds such as naphthalene, and fused heterocyclic compounds such as polyacrylonitrile (PAN), pitch, and polybenzazole fibers, among which mesophase pitch or polybenzazole fibers are preferably used. When mesophase pitch is used, the anisotropy thereof causes the pitch to orient in the fiber axis direction in the spinning step, and thus graphitized carbon fibers having excellent thermal conductivity in that fiber axis direction can be obtained. The mesophase pitch is not particularly limited as long as it can be spun, and the mesophase pitch may be used alone or may be used in combination of two or more types as appropriate; however, from the viewpoints of high thermal conductivity, spinnability, and quality stability, mesophase pitch is particularly preferably used alone, that is, graphitized carbon fibers having a mesophase pitch content of 100% is particularly preferably used.

Meanwhile, polybenzazole fibers have aromatic rings in the main chains, and when the fibers are heat-treated to be graphitized, carbon powder in which the graphite layer planes are highly developed in the main chain direction can be obtained. Thus, the obtained carbon fibers have particularly excellent thermal conductivity in a direction perpendicular to the C axis of the hexagonal graphite crystal structure, in other words, a direction parallel to the base plane (graphite layer plane). In particular, a polymer material having aromatic rings in the main chain has a higher graphitizing tendency when the number of aromatic ring structures is large, and carbon fibers having extremely excellent thermal conductivity can be obtained by using polybenzazole fibers.

Examples of the carbon fibers that can be used include carbon fibers obtained by sequentially performing processes of spinning, infusibilizing, and carbonizing, and then performing crushing or cutting into a particular particle diameter, followed by graphitizing, and carbon fibers obtained by performing carbonizing, crushing or cutting, and then graphitizing. When crushing or cutting is performed before graphitizing, a polycondensation reaction and a cyclization reaction progress more smoothly during the graphitization process since the reactions proceed at newly exposed surface resulting from crushing; thus, the degree of graphitization can be increased, and graphitized carbon fibers with further improved thermal conductivity can be obtained. Meanwhile, when spun carbon fibers are graphitized and then crushed, the carbon fibers after graphitizing are hard and thus are easy to crush; thus, carbon fibers with a relatively narrow fiber length distribution can be obtained by performing crushing for a short time.

The fiber diameter of the carbon fibers is preferably 5 to 20 μm. Industrial production can be smoothly carried out when the fiber diameter is in the range of 5 to 20 μm, and the thermal conductivity of the sheet can be increased. In contrast, the productivity is degraded when the fiber diameter is smaller than 5 μm or larger than 20 μm.

The average fiber length of the carbon fibers is preferably 10 to 600 μm, and more preferably 80 to 500 μm. When the average fiber length is smaller than 10 μm, the carbon fibers in the polymer matrix contact less with one another, not enough heat transfer paths are created, and the thermal conductivity may be degraded. Meanwhile, when the average fiber length is larger than 600 μm, the carbon fibers become bulky, and it becomes difficult to load the polymer matrix with a large amount of carbon fibers. Note that the average fiber length can be calculated from the particle size distribution from observation of the carbon fibers with a microscope.

The average fiber length of the carbon fibers is preferably 40% or less of the sheet thickness, and the content of the carbon fibers having a fiber length exceeding 80% of the sheet thickness is preferably 5 mass % or less. This is because when the content of the carbon fibers having a fiber length exceeding 80% of the sheet thickness exceeds 5 mass % and the sheet is compressed, the number of carbon fibers that exceed the compressed thickness becomes large. Meanwhile, as long as the average fiber length of the carbon fibers is 50% or less of the sheet thickness, the amount of the carbon fibers larger than the sheet thickness can be decreased even when the sheet is compressed. Due to these issues, the particle size distribution of the carbon fibers is preferably narrow. From the viewpoint of increasing the thermal conductivity, it is preferable to use a mixture of multiple types of carbon fibers having different particle size distributions.

The aspect ratio of the carbon fibers preferably exceeds 2. This is because when the aspect ratio is 2 or less, it becomes difficult to orient the carbon fibers in a particular direction and to enhance the thermal conductivity. The aspect ratio is more preferably 5 or more. Here, the aspect ratio refers to the value of "length of fiber/diameter of fiber" of a carbon fiber.

The thermal conductivity in the fiber axis direction of the carbon fibers is preferably 400 W/m·K or more, more preferably 800 W/m·K or more, and particularly preferably 1000 W/m·K or more. This is to increase the thermal conductivity of the thermally conductive sheet.

The carbon fiber content relative to 100 parts by mass of the polymer matrix is preferably 60 to 150 parts by mass. When the content is less than 60 parts by mass, it becomes difficult to increase the thermal conductivity, and when the content exceeds 150 parts by mass, the viscosity of the mixed composition increases, and the orientation property may be degraded.

(Flake Graphite Powder:)

The flake graphite powder to be oriented in the polymer matrix contains flat graphite powder having a flake shape, a squamous shape, or the like. In the flake graphite powder, the graphite crystal planes spread in the surface direction, and extremely high thermal conductivity is isotropically exhibited within this surface. Thus, by orienting the surface directions of the flake surfaces in the sheet thickness direction, the thermal conductivity in the sheet thickness direction can be increased. Meanwhile, the normal directions to the flake surfaces are randomly oriented. Thus, the sheet is configured not to exhibit anisotropy in the sheet spreading direction but to conduct heat isotropically.

Examples of the flake graphite powder include natural graphite and artificial graphite, but flake graphite powder prepared by pyrolyzing a polymer film and crushing the resulting artificial graphite sheet is preferably used. According to this flake graphite powder, the thermal conductivity in the sheet surface direction can be increased. The polymer film serving as a raw material for graphitization is preferably an aromatic polymer such as polyimide. This is because a graphite film having high thermal conductivity and developed graphite structures can be obtained.

The aspect ratio of the flake graphite powder preferably exceeds 2. When the aspect ratio is 2 or less, it becomes difficult to orient the flake graphite powder in a particular direction and to increase the thermal conductivity. The aspect ratio is more preferably 5 or more. Here, the aspect ratio refers to the value of "length of long axis of flake surface/thickness (short axis)" of the flake graphite powder. Furthermore, although the effect of increasing the thermal conductivity in the orientation direction per unit weight is strengthened by increasing the aspect ratio, an excessively high aspect ratio tends to increase the viscosity of the mixed composition. From this viewpoint, the aspect ratio is more preferably in the range of 10 to 1000.

The flake graphite powder preferably has an average particle diameter in the range of 10 to 400 μm. At an average particle diameter of less than 10 μm, the viscosity increases significantly, and the properties are difficult to improve. Furthermore, at an average particle diameter exceeding 400 μm, detachment from the sheet becomes notable.

The flake graphite powder content relative to 100 parts by mass of the polymer matrix is preferably 10 to 70 parts by mass and more preferably 20 to 60 parts by mass. When the content is less than 10 parts by mass, it becomes difficult to increase the thermal conductivity, and when the content exceeds 70 parts by mass, the viscosity of the mixed composition increases, the orientation property may be degraded, and the thermal conductivity may not increase. At a content in the range of 20 to 60 parts by mass, the thermal conductivity can be dramatically increased.

The content of the thermally conductive filler, i.e., the total content of the carbon fibers and the flake graphite powder, in the polymer matrix relative to 100 parts by mass of the polymer matrix is preferably 80 to 180 parts by mass. This is because, at a content less than 80 parts by mass, there is a possibility that the thermal conductivity cannot be sufficiently increased, and, at a content exceeding 180 parts by mass, not only the thermal conductivity cannot be significantly increased, but also the viscosity of the mixed composition becomes excessively high, thereby making it difficult to orient the carbon fibers and the flake graphite powder.

The observation on the thermal conductivity by comparing the carbon fibers and the flake graphite powder is as follows.

Carbon fibers, which have a substantially uniaxial rod shape, are characterized in that the carbon fibers have small flow resistance in the liquid resin and are easy to orient and in that a large amount of carbon fibers are easily loaded since the viscosity does not increase readily. However, because the carbon fibers are uniaxial, the area in which the carbon fibers contact the additional thermally conductive filler is small, and the thermal conductivity is difficult to increase unless a large amount of the carbon fibers are loaded.

Flake graphite powder, which is flaky, is characterized in that the flake graphite powder has large flow resistance in the liquid resin and is difficult to orient and in that a large amount of the flake graphite powder is difficult to load since the viscosity easily increases. However, because of the flaky shape, the contact area with the additional thermally conductive filler is large, and presumably the thermal conductivity can be easily increased by using a relatively small amount.

Actually, the upper limit of the viscosity for orienting the carbon fibers and the flake graphite powder in the mixed composition is about 1000 Pa·s when the flow orientation such as extrusion molding is utilized, and is about 500 Pa·s when orientation is achieved by applying a magnetic field. Assuming that a thermally conductive filler is to be added within this particular viscosity range that enables orientation, a relatively large amount of carbon fibers can be loaded if the carbon fibers alone are contained, but it is difficult to increase the thermal conductivity to the desired level. Meanwhile, if the flake graphite powder alone is to be added, the thermal conductivity may be easily increased, but a large amount of the flake graphite powder cannot be loaded, and it is also difficult to increase the thermal conductivity to the desired level.

However, when the total amount of the carbon fibers and the flake graphite powder is set to be 100% and when the percentage of the carbon fibers is set in the range of 46% to 92%, the thermal conductivity can be increased compared to when the carbon fibers are used alone or the flake graphite powder is used alone. When the percentage is in the range of 54% to 85%, the thermal conductivity can be dramatically increased, and the thermal conductivity is successfully increased by about 30% at most.

(Additional Thermally Conductive Filler:)

The thermally conductive sheet can contain a thermally conductive filler other than the carbon fibers and the flake graphite powder. Here, the thermally conductive filler other than the carbon fibers and the flake graphite powder described above is referred to as the "additional thermally conductive filler". This additional thermally conductive filler preferably has the following properties.

An example of a first preferable embodiment is a thermally conductive powder having an aspect ratio of 2 or less. A powder having an aspect ratio of 2 or less does not readily increase the viscosity of the mixed composition even when the amount added is relatively large; and when powders having different particle diameters are used in combination, an effect of decreasing the viscosity of the mixed composition is exhibited compared to when one such a powder is used alone. Since the flake graphite powder is oriented in the sheet thickness direction and a thermally conductive filler having a small aspect ratio is contained, particles of the additional thermally conductive filler suitably lie in the gaps between the surfaces of the oriented flake graphite powder, and a thermally conductive sheet having high thermal conductivity is obtained. A spherical thermally conductive powder is preferable since this effect is particularly high.

An example of a second preferable embodiment is a non-magnetic or extremely low magnetic thermally conductive powder. When a mixed composition is placed in a strong magnetic field of about 1 T (tesla) or higher, the carbon fibers and the flake graphite powder can be oriented in the desired direction, although this depends on the viscosity of the mixed composition. Meanwhile, a non-magnetic or extremely low magnetic thermally conductive powder has no or very little interaction in the magnetic field; thus, the non-magnetic or extremely low magnetic thermally conductive powder can be randomly dispersed without being oriented in the thermally conductive sheet. Thus, adding a non-magnetic or extremely low magnetic thermally conductive powder to the thermally conductive sheet enhances heat transfer not only in the sheet thickness direction but also in the surface direction. Thus, this thermally conductive powder contributes to the action of linking the carbon fibers and the flake graphite powder in the sheet surface direction, and the thermal conductivity in the sheet thickness direction can also be improved.

Examples of the additional thermally conductive filler include spherical or irregular-shaped powders of metals, metal oxides, metal nitrides, metal carbides, metal hydroxides, or the like, and spherical graphite. Examples of the metals include aluminum, copper, and nickel, examples of the metal oxides include aluminum oxide, magnesium oxide, zinc oxide, and quartz, and examples of the metal nitrides include boron nitride and aluminum nitride. An example of the metal carbide is silicon carbide, and an example of a metal hydroxide is aluminum hydroxide. Among these thermally conductive powders, aluminum oxide and aluminum are preferable since they have high thermal conductivity, and spherical products are available; and aluminum hydroxide is preferable since availability is high and the flame retardancy of the thermally conductive sheet can be improved.

The average particle diameter of the additional thermally conductive filler is preferably 0.5 to 50 μm. When the average particle diameter exceeds 50 μm, the size thereof approaches the size of the carbon fibers and the flake graphite powder, and orientation of the carbon fibers and the flake graphite powder may be disturbed. Meanwhile, a thermally conductive filler having an average particle diameter of less than 0.5 μm has a large specific surface area; thus, the viscosity increases, and it is difficult to load a large amount of such a filler. However, as long as the loadability is not adversely affected, a thermally conductive filler having a diameter of less than 0.5 μm may be contained. Moreover, when carbon fibers having an average fiber length of 50 μm or less or a flake graphite powder having an average particle diameter of 50 μm or less is used, a thermally conductive filler having an average particle diameter smaller than these is preferably used. The average particle diameter of the thermally conductive filler can be indicated by the volume-average particle diameter in a particle size distribution measured by a laser diffraction/scattering method (JIS R 1629).

The amount of the additional thermally conductive filler added relative to 100 parts by mass of the polymer matrix is preferably in the range of 250 to 700 parts by mass and more preferably in the range of 350 to 600 parts by mass. When the amount is less than 250 parts by mass, not enough of the additional thermally conductive filler is in the gaps between the carbon fibers and the flake graphite powder, and the thermal conductivity may be degraded. When the amount exceeds 700 parts by mass, the effect of increasing the thermal conductivity no longer improves, and thermal conduction through the carbon fibers and the flake graphite powder may even be obstructed. When the amount is within the range of 350 to 600 parts by mass, the thermal conductivity is excellent, and the viscosity of the mixed composition is preferable.

(Additives:)

Various additives can be added as long as the functions of the thermally conductive sheet are not impaired. For example, organic components, such as a plasticizer, a dispersing agent, a coupling agent, and an adhesive, may be added. As additional components, a flame retardant, an antioxidant, a coloring agent, and the like may be added as appropriate.

(Method for Production:)

Production of a thermally conductive sheet using the above-described raw materials will now be described.

Into a liquid resin, such as a reactive liquid resin, that forms a polymer matrix by curing, thermally conductive fillers such as carbon fibers, a flake graphite powder, and an additional thermally conductive filler, and additives and the like are added, and the resulting mixture is mixed and stirred to obtain a mixed composition in which the thermally conductive fillers are dispersed in the reactive liquid resin. When the reactive liquid resin is of a type that undergoes curing by mixing a main agent with a curing agent, the thermally conductive fillers can be dispersed in one or both of the main agent and the curing agent, and the main agent and the curing agent are mixed to prepare a mixed composition.

Next, the mixed composition is poured into a particular mold. In one embodiment, a mold having the same shape as the thermally conductive sheet to be obtained as a final product is used. A magnetic field is applied to the mixed composition in the mold so as to orient the carbon fibers and the flake graphite powder in the sheet thickness direction. While maintaining this oriented state, heating is performed to cure the reactive liquid resin in the mixed composition so as to obtain a thermally conductive sheet in which the carbon fibers and the flake graphite powder are oriented in the polymer matrix.

In order to orient the carbon fibers and the flake graphite through magnetic field orientation, the viscosity of the mixed composition is preferably 10 to 500 Pa·s. At a viscosity less than 10 Pa·s, the carbon fibers, the flake graphite powder, and the additional thermally conductive filler may settle, and, at a viscosity exceeding 500 Pa·s, the flowability is so low that the carbon fibers and the flake graphite powder do not orient or take a long time to orient by the magnetic field. However, the viscosity can be set to less than 10 Pa·s in some cases by using a thermally conductive filler that does not easily settle or by combining an additive, such as antisettling agent.

Examples of the magnetic line generation source used to apply a magnetic line include a superconducting magnet, a permanent magnet, an electromagnet, and a coil, but a superconducting magnet is preferable since it can generate a magnetic field with a high magnetic flux density. The magnetic flux densities of the magnetic fields generated from these magnetic line generation sources are preferably 1 to 30 tesla. When the magnetic flux density is less than 1 tesla, it becomes difficult to orient the carbon fibers and the flake graphite powder. In contrast, a magnetic flux density exceeding 30 tesla is practically difficult to obtain.

The carbon fibers and the flake graphite powder can be oriented by extrusion molding instead of applying the magnetic field. In extrusion molding, the properties to flow orient are utilized so that the carbon fibers can be oriented in the flow direction of the mixed composition during extrusion molding. In other words, after the carbon fibers and the flake graphite powder are oriented by extrusion molding, the mixed composition is cured to obtain a thermally conductive sheet.

In another embodiment, molding can be performed by using a mold with a shape different from that of the thermally conductive sheet to be obtained as a final product. The mold here is used to obtain a block-like molded body in the stage before forming into the shape of the final-product thermally conductive sheet. The method involves forming a block-like molded body having a substantially rectangular parallelepiped outline from the mixed composition, and then cutting or machining (hereinafter, collectively referred to as "slicing") the block-like molded body in the subsequent step to reduce the thickness of the resulting product and to obtain a thermally conductive sheet having a desired thickness.

The method up to obtaining a polymer matrix in which the carbon fibers and the flake graphite powder are oriented is identical except for the mold. The obtained block-like molded body is subjected to a step of slicing the block-like molded body at a flat plane perpendicular to the orientation direction of the carbon fibers. Various means such as a blade, a wire rod, and a laser may be employed as the cutting means, and a shear blade, a push-cutting blade, a plane, or the like can be used as the blade. In order to plane the obtained block-like molded body, the blade angle with respect to the plane flat surface is set to 45°, the length of the blade protruding from the plane surface is set to 0.5 mm, and the block-like molded body can be planed by pressing the plane against the block-like molded body at a pressure of about 0.2 to 0.3 MPa.

The surface of the resulting thermally conductive sheet subjected to this slicing step turns into a sliced surface.

A polishing step can be performed on the sliced surface if needed. In the polishing step, abrasive paper, a cloth, a file, or the like is used to polish end surfaces of the carbon fibers exposing from the sheet surface. In this manner, the end surfaces of the exposed carbon fibers are squashed flat. These end surfaces have effects of increasing the adhesion with the heat-generating element or a heat-dissipating element and of decreasing the thermal resistance of the thermally conductive sheet obtained as a final product.

A known example of a method for orienting the carbon fibers and the flake graphite powder involves applying a mixed composition by using a slit coater or by an application method so as to form thin, semi-cured primary sheets, stacking and curing the primary sheets, and slicing the resulting cured product from an end portion. However, when a thermally conductive sheet is prepared by this method, the normal directions to the flake surfaces of the flake graphite powder become oriented, and thus, not only orientation is achieved in the thickness direction but also in one direction within the surface. Thus, a thermally conductive sheet in which the flake surfaces of the flake graphite powder are oriented in random directions is not obtained.

Moreover, according to this method that involves stacking the primary sheets, a skin layer with a higher polymer matrix concentration is formed on a surface during formation of the primary sheet. Thus, since the skin layers are present between the stacked primary sheets, portions with a low thermally conductive filler concentration occur in the polymer matrix, and the thermal conduction may be inhibited. Thus, this method is preferably not used.

(Properties of Thermally Conductive Sheet:)

In the thermally conductive sheet, since the carbon fibers and the flake graphite powder have long axes thereof oriented in the sheet thickness direction, the thermal conductivity in the sheet thickness direction can be increased; moreover, since the short axes of the flake graphite powder are randomly oriented perpendicular to the long axes, there are more contact portions between the flakes of the flake graphite powder than when the short axes are oriented in a particular direction, thereby increasing the thermal conductivity in the sheet thickness direction.

Moreover, since the carbon fibers and the flake graphite powder are contained in particular proportions, the thermal conductivity can be increased without significantly increasing the thermally conductive filler content relative to the polymer matrix, and thus a flexible thermally conductive sheet can be prepared.

EXAMPLES

Preparation of Mixed Composition:

To 100 parts by mass of a main agent for addition-reaction-type silicone, 130 parts by mass of carbon fibers (average fiber length: 100 μm), and, as the additional thermally conductive filler, 250 parts by mass of aluminum oxide (spherical, average particle diameter: 10 μm) and 250 parts by mass of aluminum hydroxide (irregular shape, average particle diameter: 8 μm) were added so as to obtain a mixed composition (main agent). Furthermore, regarding a curing agent for the addition-reaction-type silicone, as with the main agent, to 100 parts by mass of a curing agent for the addition-reaction-type silicone, 130 parts by mass of carbon fibers (average fiber length: 100 μm), and, as the additional thermally conductive filler, 250 parts by mass of aluminum oxide (spherical, average particle diameter: 10 μm) and 250 parts by mass of aluminum hydroxide (irregular shape, average particle diameter: 8 μm) were added so as to obtain a mixed composition (curing agent). Then the mixed composition (main agent) and the mixed composition (curing agent) were mixed to prepare a mixed composition (mixture of the main agent and the curing agent) of Sample 1.

Mixed compositions of Samples 2 to 24 were obtained as with Sample 1 except that the raw materials and the blend (parts by mass) were changed as shown in Tables 1 to 3.

Regarding the raw materials indicated in the tables, the flake graphite powder has an average particle diameter of 130 μm and an aspect ratio of about 10. Graphene has an average particle diameter of 80 μm and an aspect ratio of 8000. The spherical graphite has an average particle diameter of 20 μm. Aluminum oxide is spherical and has an average particle diameter of 20 μm. In Samples 22 to 24, the additional thermally conductive filler is the same as Sample 1, that is, aluminum oxide and aluminum hydroxide, and the contents of the two compounds are the same.

In the tables, the total mass of the carbon fibers and the flake graphite powder is represented by (A)+(B), and the ratio of the mass of the carbon fibers to the total mass of the carbon fibers and the flake graphite powder is represented by (A)/[(A)+(B)].

Regarding the raw materials described above, the average fiber length of the carbon fibers is measured with an electron microscope. Specifically, the lengths of 100 carbon fibers were measured with an electron microscope, and the average value thereof was assumed to be the average fiber length. The average particle diameters of the flake graphite powder and the thermally conductive filler are volume-average particle diameters in the particle size distributions measured by a laser diffraction/scattering method (JIS R 1629).

Preparation of Thermally Conductive Sheet:

Mixed compositions of Samples 1 to 12 and Samples 14 to 24 were each poured into a mold, and a 10 tesla magnetic field was applied while vibrating the molding material in the mold so that the carbon fibers and the flake graphite powder oriented in the vertical direction of the mold. Subsequently, the addition-reaction-type silicone was cured by heating at 90° C. for 60 minutes, and then the molded body was released from the mold. The obtained molded body was cut to a size of a test piece from which the thermal resistance described below can be measured, in other words, the obtained formed body was cut into a 26 mm×26 mm square sheet having a thickness of 2 mm, the thickness being in the direction in which the carbon fibers and the flake graphite powder were oriented so as to obtain thermally conductive sheets of Samples 1 to 12 and Samples 14 to 24.

For Sample 13, the mixed composition was applied by using a coater to form thin-film-shaped primary sheets, and the primary sheets were stacked and completely cured to form a block-like body, and the block-like body was sliced along the stacking direction to obtain a secondary sheet having a thickness of 2 mm. Next, a 26 mm×26 mm square piece was cut out from this secondary sheet to obtain a thermally conductive sheet of Sample 13.

In Tables 1 to 3, Samples 1 to 12 and Samples 14 to 24 in which the sheet thickness direction and the orientation direction of the carbon fibers and the flake graphite powder are the same but the normal directions to the flake surfaces of the flake graphite powder are randomly oriented in the sheet surface direction are indicated by "○", and Sample 13 in which although the sheet thickness direction and the orientation direction of the carbon fibers and the flake graphite powder are the same, the normal directions to the flake surfaces of the flake graphite powder are oriented in one direction within the sheet surface is indicated by "x".

TABLE 1

| | | Sample 1 | Sample 2 | Sample 3 | Sample 4 | Sample 5 | Sample 6 | Sample 7 | Sample 8 | Sample 9 |
|---|---|---|---|---|---|---|---|---|---|---|
| Blend | Matrix | 100 | 100 | 100 | 100 | 100 | 100 | 100 | 100 | 100 |
| | Carbon fibers (A) | 130 | 120 | 110 | 90 | 80 | 70 | 60 | 50 | — |
| | Flake graphite powder (B) | — | 10 | 20 | 40 | 50 | 60 | 70 | 80 | 130 |
| | Graphene | — | — | — | — | — | — | — | — | — |
| | Spherical graphite | — | — | — | — | — | — | — | — | — |
| | Aluminum oxide | — | — | — | — | — | — | — | — | — |
| | Additional thermally conductive filler | 500 | 500 | 500 | 500 | 500 | 500 | 500 | 500 | 500 |
| | (A)/[(A) + (B)] | 1 | 0.92 | 0.85 | 0.69 | 0.62 | 0.54 | 0.46 | 0.38 | 0 |
| | (A) + (B) | 130 | 130 | 130 | 130 | 130 | 130 | 130 | 130 | 130 |
| Orientation Properties | Orientation | ○ | ○ | ○ | ○ | ○ | ○ | ○ | ○ | ○ |
| | Viscosity of mixed composition (Pa · s) | 40 | 43 | 58 | 147 | 180 | 231 | 269 | 291 | 500 or more |
| | Thermal conductivity (W/m · K) | 9.2 | 10.6 | 11.1 | 11.5 | 12.2 | 11.2 | 10.5 | 7.4 | 3.3 |

TABLE 2

| | | Sample 10 | Sample 11 | Sample 12 | Sample 13 | Sample 14 | Sample 15 | Sample 16 | Sample 17 | Sample 18 | Sample 19 |
|---|---|---|---|---|---|---|---|---|---|---|---|
| Blend | Matrix | 100 | 100 | 100 | 100 | 100 | 100 | 100 | 100 | 100 | 100 |
| | Carbon fibers (A) | 180 | 115 | — | 90 | 90 | — | 90 | — | 90 | — |
| | Flake graphite powder (B) | — | 50 | 90 | 40 | 40 | 130 | 40 | 130 | 40 | 130 |
| | Graphene | — | — | — | — | — | — | — | — | — | — |
| | Spherical graphite | — | — | — | — | — | — | — | — | — | — |
| | Aluminum oxide | — | — | — | — | — | — | — | — | — | — |
| | Additional thermally conductive filler | 500 | 500 | 500 | 500 | 500 | 500 | 500 | 500 | 500 | 500 |
| | (A)/[(A) + (B)] | 1 | 0.7 | 0 | 0.69 | 1 | — | 1 | — | 1 | — |
| | (A) + (B) | 180 | 165 | 90 | 130 | 90 | 0 | 90 | 0 | 90 | 0 |
| Orientation Properties | Orientation | ○ | ○ | ○ | x | ○ | ○ | ○ | ○ | ○ | ○ |
| | Viscosity of mixed composition (Pa · s) | 300 | 270 | 450 | 35 | 78 | 500 or more | 100 | 80 | 75 | 80 |
| | Thermal conductivity (W/m · K) | 9.2 | 12 | 4.1 | 5.1 | 8.5 | 2.9 | 8.8 | 3.1 | 8.5 | 1.9 |

TABLE 3

|  |  | Sample 20 | Sample 21 | Sample 22 | Sample 23 | Sample 24 |
|---|---|---|---|---|---|---|
| Blend | Matrix | 100 | 100 | 100 | 100 | 100 |
|  | Carbon fibers (A) | 150 | 70 | 90 | 60 | 70 |
|  | Flake graphite powder (B) | 30 | 10 | 40 | 10 | 20 |
|  | Graphene | — | — | — | — | — |
|  | Spherical graphite | — | — | — | — | — |
|  | Aluminum oxide | — | — | — | — | — |
|  | Additional thermally conductive filler | 500 | 500 | 250 | 700 | 700 |
|  | (A)/[(A) + (B)] | 0.83 | 0.88 | 0.69 | 0.86 | 0.77 |
|  | (A) + (B) | 180 | 80 | 130 | 70 | 90 |
| Orientation |  | ○ | ○ | ○ | ○ | ○ |
| Properties | Viscosity of mixed composition (Pa · s) | 400 | 37 | 80 | 57 | 180 |
|  | Thermal conductivity (W/m · K) | 10 | 8.8 | 10.3 | 8.5 | 9.3 |

Properties of Samples:
(Measurement of Viscosity of Mixed Composition:)

The viscosities of the mixed compositions of the samples were measured. The viscosity is a value measured with a viscometer (rotational viscometer DV-E produced by BROOKFIELD) with a No. 14 spindle as a rotor at a rotation speed of 10 rpm and a measurement temperature of 23° C. The viscosities of the mixed compositions of the samples are indicated in Tables 1 to 3.

(Measurement of Hardness of Thermally Conductive Sheet:)

The hardness values of the thermally conductive sheets of the samples were measured. The hardness is a value of E-hardness measured with a type-E durometer in accordance with provisions of JIS K 6253.

(Measurement of Thermal Conductivity:)

Figure 5:
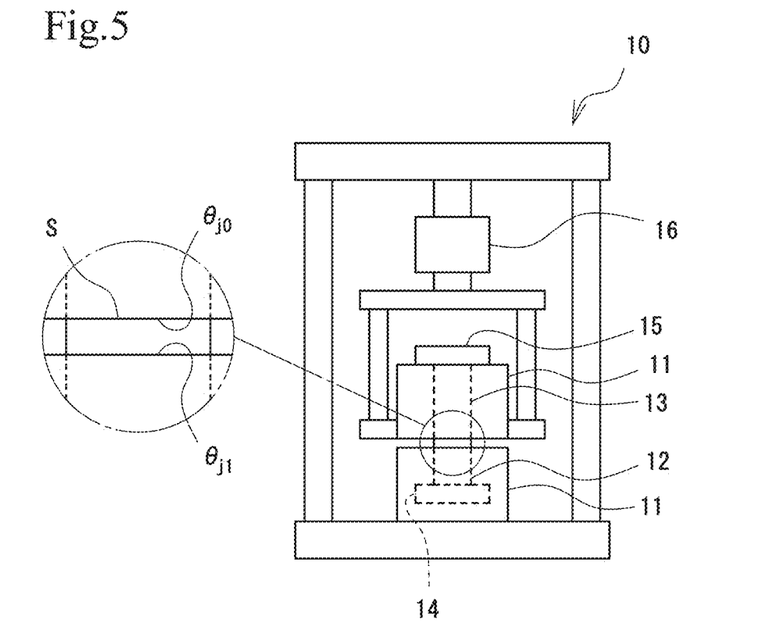
FIG. 5 is a schematic diagram of a thermal conductivity meter.

The thermal conductivity was measured with a thermal conductivity meter illustrated in the schematic diagram in FIG. 5 by a process in accordance with ASTM D 5470-06. More specifically, the thermally conductive sheets of the samples serving as test pieces S were each attached to a copper block 12 having a 25.4 mm×25.4 mm measurement surface and side surfaces covered with a thermal insulator 11, an upper copper block 13 was placed thereon, and a load was applied by a load cell 16 so that the compression ratio was 10%. Here, the lower copper block 12 was in contact with a heater 14. Moreover, the upper copper block 13 was connected to a heat sink 15 equipped with a fan. Next, the heater 14 was turned on so that the surface of the lower copper block 12 reached 80° C., and 15 minutes thereafter when the temperature entered a substantially steady state, the temperature ($\theta_{j0}$) of the upper copper block 13 and the amount of heat (Q) generated by the heater were measured, the thermal resistance of each sample was determined from equation (1) below, and the thermal conductivity was determined from equation (2) below. Moreover, the thickness T of each test piece S was also measured.

Thermal resistance=$(\theta_{j1}-\theta_{j0})/Q$  equation (1)

In equation (1), $\theta_{j1}$ represents the temperature (80° C.) of the lower copper block 12, $\theta_{j0}$ represents the temperature of the upper copper block 13, and Q represents the amount of heat generated.

Thermal conductivity=$T$/thermal resistance  equation (2)

In equation (2), T represents the thickness of each test piece.

Evaluation of Samples:
(Hardness:)

As for the hardness of the thermally conductive sheet of each sample, in Samples 1 to 12 and Samples 14 to 24, the hardness was within the range of E32 to E37 and was about the same. However, the hardness was E60 in Sample 13, which was higher than other samples.

(Thermal Conductivity:)

Sample 1 contains 130 parts of carbon fibers (does not contain a flake graphite powder), Sample 9 contains 130 parts of a flake graphite powder (does not contain carbon fibers), and these two samples are the same in terms of the amount of the thermally conductive filler blended; however, the results indicated that the mixed composition of Sample 1 had a lower viscosity and a higher thermal conductivity (comparison between Sample 1 and Sample 9).

Moreover, although Sample 10 was prepared by further increasing the amount of the carbon fibers blended from that in Sample 1 so that the viscosity was close to the limit that allowed magnetic field orientation, the thermal conductivity did not change from Sample 1. Meanwhile, Sample 9, which contained a flake graphite powder alone without any carbon fibers, had a high viscosity; thus, Sample 12 was prepared by decreasing the amount of the flake graphite powder blended so that the viscosity was close to the limit suitable for orienting the flake graphite powder by using a magnetic field. The thermal conductivity of Sample 12 was larger than that of Sample 9. These results show that increasing merely the amount of the carbon fibers or the flake graphite powder blended does not further improve the thermal conductivity after a particular amount or more (comparison of Sample 1, Sample 9, Sample 10, and Sample 12).

In the description of the examples, those samples which contain an additional thermally conductive filler and carbon fibers but no flake graphite powder are referred to as samples that use carbon fibers alone, and samples which contain an additional thermally conductive filler and a flake graphite powder but no carbon fibers are referred to as samples that use a flake graphite powder alone.

Of Samples 2 to 8 in which the total amount of the carbon fibers and the flake graphite powder was 130 parts by mass, the thermal conductivity was higher in Samples 2 to 7 than in Sample 1, which contained 130 parts by mass of carbon fibers but no flake graphite powder. Of Samples 2 to 7, particularly, the thermal conductivity in Samples 3 to 6 was 20% or more higher than that in Sample 1, and using the carbon fibers and the flake graphite powder together could drastically increase the thermal conductivity compared to when the carbon fibers were used alone or the flake graphite powder was used alone (comparison of Sample 1 with Samples 2 to 7).

In Sample 2, in which the thermal conductivity improved from Sample 1 not containing the flake graphite powder, the ratio of the carbon fibers to the total of the carbon fibers and the flake graphite powder is 0.92, and this shows that the thermal conductivity can be improved by mixing while setting the ratio of the carbon fibers to 0.92 or less. Meanwhile, in Sample 7, in which the thermal conductivity improved from Sample 9 not containing the carbon fibers, the ratio of the carbon fibers to the total of the carbon fibers and the flake graphite powder is 0.46, and this shows that the thermal conductivity can be improved by mixing while setting the ratio of the carbon fibers to 0.46 or more. In other words, as long as the ratio of the carbon fibers to the total of the carbon fibers and the flake graphite powder is in the range of 0.46 to 0.92, the thermal conductivity is increased compared to when the carbon fibers are used alone or the flake graphite powder is used alone. In particular, in Sample 5, in which the ratio of the carbon fibers is 0.62, the thermal conductivity is 30% or more higher than that in Sample 1, in which the carbon fibers are used alone (comparison of Sample 1 with Samples 2 to 7).

When the thermally conductive sheets of Sample 4 and Sample 13, which have the same blend but differ from each other in that whether the normal directions to the flake surfaces of the flake graphite powder are random or are oriented in a particular direction, are compared, the thermal conductivity was higher in Sample 4 than in Sample 13. This shows that when the normal directions to the flake surfaces of the flake graphite powder are random, the thermal conductivity can be significantly improved (comparison between Sample 4 and Sample 13).

Focusing now on Sample 15 in which graphene was added instead of the flake graphite powder, the thermal conductivity was lower than that in Sample 9, in which the flake graphite powder was used. Moreover, in Sample 14, which was same as Sample 1 using carbon fibers alone except for that some of the carbon fibers were replaced by graphene, the thermal conductivity was lower than that in Sample 1. This shows that the effect of increasing the thermal conductivity is not exhibited even when the carbon fibers and graphene are used together (comparison of Sample 1 with Sample 14 and Sample 15).

Similarly, focusing on Sample 17 in which spherical graphite powder was used instead of the flake graphite powder, the viscosity was low, but the thermal conductivity was low compared to Sample 9 which used spherical graphite powder. Moreover, in Sample 16, which was the same as Sample 1 using carbon fibers alone except for that some of the carbon fibers were replaced by a spherical graphite powder, the thermal conductivity was lower than that in Sample 1; and this shows that the effect of increasing the thermal conductivity is not exhibited even when the carbon fibers and a spherical graphite powder are used together (comparison of Sample 1 with Sample 16 and Sample 17).

Furthermore, focusing on Sample 19 in which aluminum oxide was used instead of the flake graphite powder, the viscosity was low, but the thermal conductivity was low compared to Sample 9 in which the spherical graphite powder was used. Moreover, in Sample 18, which was the same as Sample 1 using carbon fibers alone except for that some of the carbon fibers were replaced by aluminum oxide, the thermal conductivity was lower than that in Sample 1; and this shows that the effect of increasing the thermal conductivity, such as one exhibited when the carbon fibers and the flake graphite powder are used together, is not exhibited even when the carbon fibers and aluminum oxide are used together (comparison of Sample 1 with Sample 18 and Sample 19).

In Samples 20 to 24, in which the total amount of the carbon fibers and the flake graphite powder and the amount of the additional thermally conductive filler blended are changed from Samples 2 to 8 in which the total of the carbon fibers and the flake graphite powder is 130 parts by mass and the amount of the additional thermally conductive filler is 500 parts by mass, Sample 20 exhibited a slightly high viscosity but the thermal conductivity was higher than Sample 1 in which the carbon fibers are used alone. In Sample 21, the total of the carbon fibers and the flake graphite powder is 80 parts by mass, that is, the amount of the thermally conductive filler is reduced was about 60% of that in Sample 1 in which 130 parts by mass of carbon fibers are used alone; however, the decrease in thermal conductivity was not significant.

The amount of the carbon fibers+flake graphite powder blended is the same in Sample 22 and Samples 2 to 8; however, although the amount of the additional thermally conductive filler was reduced to half in Sample 22, the decrease in thermal conductivity was little, and the thermal conductivity was about the same level as Sample 7. In Sample 23, since the total of the carbon fibers+the flake graphite powder was as small as 70 parts by mass, the thermal conductivity could not be increased despite that as much as 700 parts by mass of the additional thermally conductive filler was blended; however, in Sample 24, high thermal conductivity was obtained.

The total amount of the carbon fibers, the flake graphite powder, and the additional thermally conductive filler blended is smallest in Sample 22, i.e., 380 parts by mass, and largest in Sample 24, i.e., 790 parts by mass; and this shows that the viscosity of the mixed composition is at a preferable level and the thermal conductivity of the obtained thermally conductive sheet is increased when the total of the thermally conductive fillers added, that is, the total amount of the carbon fibers, the flake graphite powder, and the additional thermally conductive filler, relative to 100 parts by mass of the polymer matrix is 380 to 790 parts by mass.

The embodiments and examples described above are merely illustrative examples of the present invention, and alterations of the embodiments and the examples, addition of and combining with of known features, etc., are possible without departing from the gist of the present invention, and such technical features are also included in the scope of the present invention.

REFERENCE SIGNS LIST 1 thermally conductive sheet
2 polymer matrix
3 carbon fibers
4 flake graphite powder
5 additional thermally conductive filler
10 thermal conductivity meter
11 thermal insulator
12 lower copper block
13 upper copper block
14 heater
15 heat sink equipped with a fan
16 load cell
S test piece
$\theta_{j0}$ temperature of upper copper block 13
$\theta_{j1}$ temperature of lower copper block 12

The invention claimed is:
1. A thermally conductive sheet comprising carbon fibers and a flake graphite powder that are dispersed in a polymer matrix, wherein the flake graphite powder is disposed between the carbon fibers, fiber axis directions of the carbon fibers are oriented in a sheet thickness direction, long axis directions of flake surfaces of the flake graphite powder are oriented in the sheet thickness direction, and normal directions to the flake surfaces are randomly oriented in a surface direction of the sheet by directing short axis directions of the flake surfaces to random directions perpendicular to the long axis directions, and a mass ratio of the carbon fibers to the flake graphite powder is in a range of 120:10 to 60:70.

2. The thermally conductive sheet according to claim 1, wherein the carbon fibers and the flake graphite powder are contained so that a total mass of the carbon fibers and the flake graphite powder is 80 to 180 parts by mass relative to 100 parts by mass of the polymer matrix.

3. The thermally conductive sheet according to claim 1, further comprising a thermally conductive filler other than the carbon fibers and the flake graphite powder, wherein the thermally conductive filler has an average particle diameter smaller than an average fiber length of the carbon fibers and smaller than an average particle diameter of the flake graphite powder, and has an aspect ratio of 2 or less.

4. The thermally conductive sheet according to claim 2, further comprising a thermally conductive filler other than the carbon fibers and the flake graphite powder, wherein the thermally conductive filler has an average particle diameter smaller than an average fiber length of the carbon fibers and smaller than an average particle diameter of the flake graphite powder, and has an aspect ratio of 2 or less.

5. The thermally conductive sheet according to claim 3, wherein the thermally conductive filler comprises aluminum oxide and aluminum hydroxide.

6. The thermally conductive sheet according to claim 4, wherein the thermally conductive filler comprises aluminum oxide and aluminum hydroxide.

7. The thermally conductive sheet according to claim 3, wherein a total of 380 to 790 parts by mass of the carbon fibers, the flake graphite powder, and the thermally conductive filler are contained relative to 100 parts by mass of the polymer matrix.

8. The thermally conductive sheet according to claim 4, wherein a total of 380 to 790 parts by mass of the carbon fibers, the flake graphite powder, and the thermally conductive filler are contained relative to 100 parts by mass of the polymer matrix.

9. The thermally conductive sheet according to claim 5, wherein a total of 380 to 790 parts by mass of the carbon fibers, the flake graphite powder, and the thermally conductive filler are contained relative to 100 parts by mass of the polymer matrix.

10. The thermally conductive sheet according to claim 6, wherein a total of 380 to 790 parts by mass of the carbon fibers, the flake graphite powder, and the thermally conductive filler are contained relative to 100 parts by mass of the polymer matrix.

* * * * *